United States Patent
Dahnke et al.

(10) Patent No.: US 7,999,543 B2
(45) Date of Patent: Aug. 16, 2011

(54) MR METHOD FOR SPATIALLY-RESOLVED DETERMINATION OF RELAXATION PARAMETERS

(75) Inventors: Hannes Dahnke, Hamburg (DE); Tobias Schaffter, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 996 days.

(21) Appl. No.: 11/908,812

(22) PCT Filed: Mar. 10, 2006

(86) PCT No.: PCT/IB2006/050752
§ 371 (c)(1),
(2), (4) Date: Sep. 17, 2007

(87) PCT Pub. No.: WO2006/100618
PCT Pub. Date: Sep. 28, 2006

(65) Prior Publication Data
US 2009/0232410 A1    Sep. 17, 2009

(30) Foreign Application Priority Data
Mar. 23, 2005    (EP) .................................... 05102352

(51) Int. Cl.
*G01V 3/00*    (2006.01)

(52) U.S. Cl. ...................................... 324/309; 382/131
(58) Field of Classification Search .................. 324/309
See application file for complete search history.

(56) References Cited

U.S. PATENT DOCUMENTS

| | | | |
|---|---|---|---|
| 5,604,435 A | 2/1997 | Foo et al. | |
| 5,713,358 A * | 2/1998 | Mistretta et al. | 600/420 |
| 5,798,642 A * | 8/1998 | Watanabe | 324/307 |
| 5,823,959 A | 10/1998 | Rasche | |
| 5,830,143 A * | 11/1998 | Mistretta et al. | 600/420 |
| 5,873,825 A * | 2/1999 | Mistretta et al. | 600/410 |
| 6,510,335 B1 * | 1/2003 | Miyazaki | 600/419 |
| 6,891,372 B2 * | 5/2005 | Steinhoff et al. | 324/309 |
| 7,285,954 B2 * | 10/2007 | Nezafat et al. | 324/309 |
| 7,332,909 B2 * | 2/2008 | Schaffter et al. | 324/309 |
| 7,486,074 B2 * | 2/2009 | McKenzie et al. | 324/309 |
| 7,642,775 B2 * | 1/2010 | Katscher et al. | 324/307 |

(Continued)

FOREIGN PATENT DOCUMENTS

EP    1380257 A1    1/2004

(Continued)

OTHER PUBLICATIONS

Heyn, C., et al.; Detection Threshold of Single SPIO-Labeled Cells with FIESTA; 2005; MRM; 53:312-320.

*Primary Examiner* — Sath V Perungavoor

(57) ABSTRACT

An MR method and apparatus determines spatially resolved relaxation parameters of a subject in an examination zone, voxel by voxel. A first MR scan sequence is applied to generate a series of first MR data sets having different echo times. A second MR scan sequence is applied to generate at least one further MR data set having an enhanced spatial resolution and reduced time resolution in comparison with the first MR data sets from the first sequence. MR combination images are generated using the first MR data sets derived from the first sequence for a portion within the k-space and the further MR data set acquired outside this portion by the second sequence. The relaxation parameters are determined from the MR combination images.

19 Claims, 3 Drawing Sheets

U.S. PATENT DOCUMENTS

Figure 1:
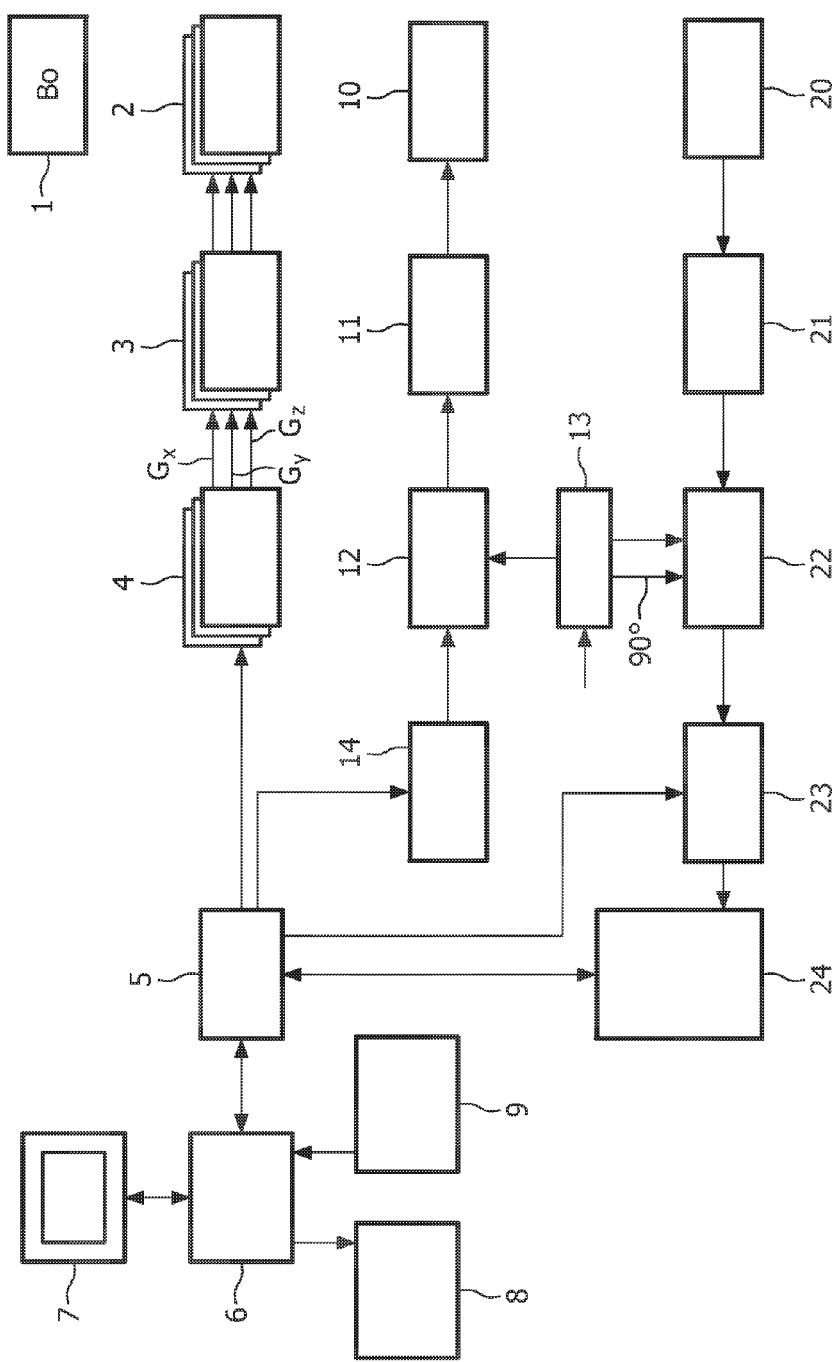

| | | | |
|---|---|---|---|
| 2002/0022779 A1* | 2/2002 | Kose | 600/422 |
| 2003/0042904 A1* | 3/2003 | Wiese et al. | 324/307 |
| 2003/0057946 A1* | 3/2003 | Shah et al. | 324/307 |
| 2003/0076098 A1* | 4/2003 | Steinhoff et al. | 324/300 |
| 2003/0193332 A1* | 10/2003 | Shah | 324/300 |
| 2006/0273790 A1* | 12/2006 | Eggers et al. | 324/309 |
| 2009/0227860 A1* | 9/2009 | Dahnke et al. | 600/420 |

FOREIGN PATENT DOCUMENTS

WO     2006018780 A1    2/2006

* cited by examiner

MR METHOD FOR SPATIALLY-RESOLVED DETERMINATION OF RELAXATION PARAMETERS

The invention relates to an MR method (MR=magnetic resonance) for spatially resolved determination of relaxation parameters in an examination zone. In addition, the invention relates to an MR apparatus for carrying out such a method and to a computer program for control of such an MR apparatus.

Relaxation parameters, such as, for example, the relaxation times T1, T2 or T2*, can be determined by acquiring a plurality of MR images of the same examination zone with different echo times (the period between excitation of the nuclear magnetization in the examination zone and the maximum of the MR echo signal caused thereby is called the echo time). If the image amplitudes that are assigned to one and the same voxel in the different MR images are compared with one another, then as a consequence of the relaxation there is a more or less marked decrease in the image amplitude as the echo time increases. Using suitable methods, the relaxation parameters can be determined from this echo time-dependent course of the image amplitude. From the relaxation parameters determined in this way for all voxels it is possible to derive a diagram, which, coded in color or with appropriate gray scale values, represents the spatial course of the relevant relaxation parameter in an image.

In order to shorten the time required for acquisition of the MR images, multi-echo sequences can be used, in which, following an excitation of the nuclear magnetization, a plurality of MR echo signals are received in succession, preferably for the same trajectory in each case in the spatial frequency space (also referred to as the k-space below).

One possible application of this investigation technique, known as relaxometry, includes the pinpointing of cells in the human body that have been marked with a suitable contrast medium, for example, a superparamagnetic iron oxide (SPIO). The particles of this contrast medium attached to a cell exert an influence on the nuclear magnetization only in their immediate vicinity, so that the relaxation there is effected more quickly than in regions that are not exposed to the influence of the contrast medium. By establishing the relaxation parameters, it is thus possible to determine the spatial distribution of the particles, or rather of the cells marked therewith, in the examination zone.

A method is known from a publication of Heyn et al in Magn Reson Med 2005; 53:312-320 which involves merely the generation of individual T2*-weighted MR images, so that a quantitative determination of the relaxation parameters is not possible. It is known from this publication, however, that the detection sensitivity for such particles rises with increasing spatial resolution or decreasing volume of the voxels of the MR images. In order to be able to manage with relatively little contrast medium (or to have a high detection sensitivity, that is, to be able to identify a small number of cells), a spatial resolution with voxel sizes of, for example, 100×100×100 µm is thus required.

On the other hand, the temporal resolution must be sufficiently large, that is, the spacing of the echo times at which the different MR images are acquired must be selected to be so narrow that the time progression of the relaxation can be tracked sufficiently exactly. In the examination of areas that already have a short relaxation time anyway, such as, for example, the liver with a T2* of 20-30 ms, which is lowered even further by the contrast medium, this leads to very short echo times or echo time differences of, for example, 3 ms.

Because of that, however, in practice the desired high spatial resolution cannot be achieved. This depends in fact on the time integral over the gradient of the magnetic field, which accompanies the reading out of the MR data (called the read-out gradient below for short). Since, for technical and medical reasons, the strength of the gradient is limited (above a specific gradient strength, nerve stimulations can occur), the read-out gradients for a higher spatial resolution must have a relatively long duration, which is not compatible with the required high time resolution (that is, a short echo time or short echo time differences).

It is an object of the present invention to conceive an MR method that delivers MR images with high time resolution and at the same time high spatial resolution.

That object is achieved by an MR method for spatially resolved determination of relaxation parameters in an examination zone, comprising the steps:

a. acquisition, by means of a first sequence, of MR data sets for a plurality of MR images with different echo times,
b. acquisition, by means of a second sequence, of at least one further MR data set for at least one further MR image, having an enhanced spatial resolution and reduced time resolution compared with the MR images of the first sequence,
c. generation of MR combination images using an MR data set for a portion within the k-space derived from the first sequence and the MR data of a further MR data set acquired outside this portion by means of the second sequence,
d. derivation of relaxation parameters from the MR combination images.

The required MR data sets are therefore acquired in the case of the invention by means of two sequences, of which one (the first) has a high time resolution and therefore a low spatial resolution, whilst the other (the second sequence) has a high spatial resolution and therefore a low time resolution. The data sets acquired in this way are combined with one another to produce MR combination images, wherein for a portion of the k-space—preferably its center—one of the MR data sets acquired with the first sequence is used, and for the area of the k-space located outside this portion an MR data set that was acquired with the other (second) sequence is used. The combination images produced from the data sets combined in this way have the high resolution achievable with the second sequence, but their contrast and time resolution is dominated by the MR data sets that were acquired with the first sequence. On the basis of the spatially high-resolution combination images, the relaxation parameters can be established with good time resolution and a high detection sensitivity.

In principle it would be possible to acquire the MR data sets with sequences in which, following an excitation of the nuclear magnetization, only one echo signal is read out. However, this would give rise to relatively long acquisition times. A shorter acquisition time is achieved by deriving a relaxation parameter from the MR combination images that depends on the details of the sequences. In one embodiment the relaxation time T2* can be determined, whilst in another embodiment, the relaxation time T2 can be determined. The relaxation time T1 can be determined, for example, by means of inversion recovery sequences or a saturation recovery sequence.

At the boundaries of an object to be examined, susceptibility jumps can occur, which cause macroscopic inhomogeneities of the magnetic field. Thus, in the case of a gradient echo sequence, phase shifts can occur, which lead to artifacts if the combined MR data sets have been acquired with different echo times. These artifacts can be eliminated by presupposing that the MR data are present in the form of complex data with magnitude and phase, that is, with a real and an imaginary component.

These and other aspects of the invention are apparent from and will be elucidated with reference to the embodiments described hereinafter.

Figure 2:
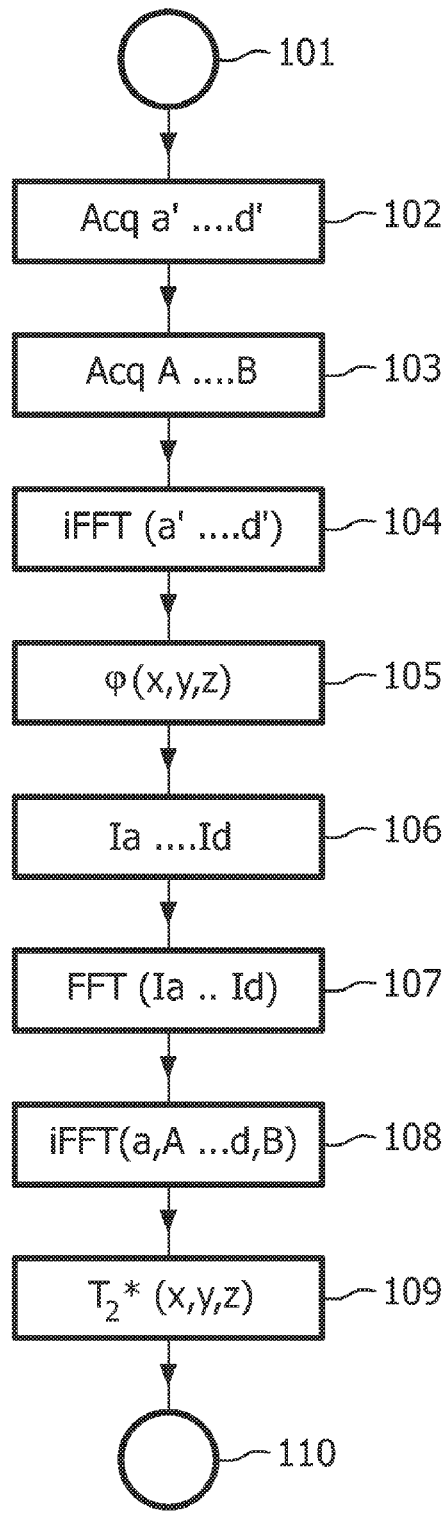
Figure 3:
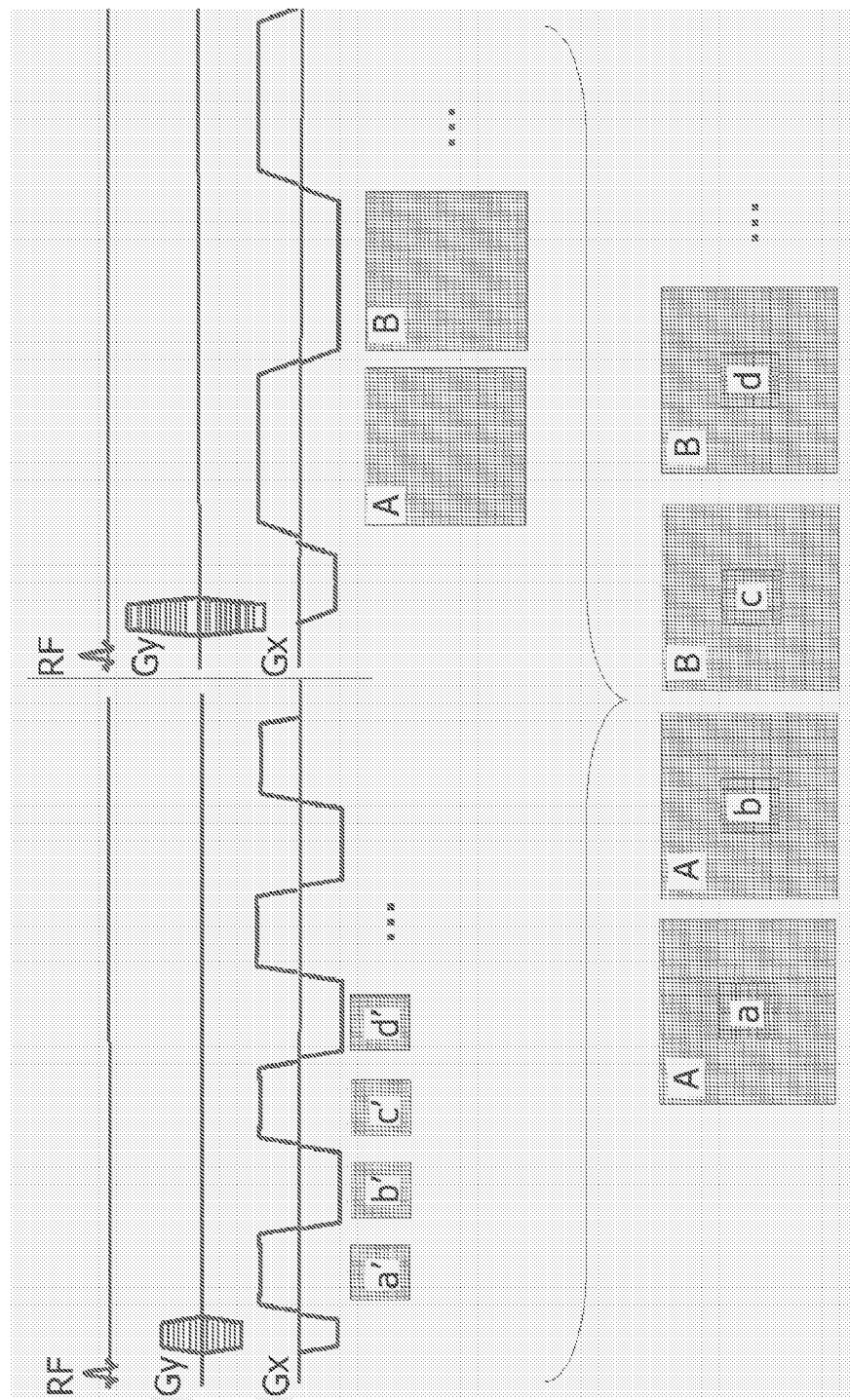

In the drawings:

FIG. 1 shows the block diagram of an MR apparatus with which the invention can be carried out, FIG. 2 shows a block diagram that explains the operational sequence of the method according to the invention, and FIG. 3 shows a schematic representation of two sequences that are suitable for the method according to the invention.

In FIG. 1, the reference numeral 1 denotes a schematically illustrated main field magnet, which generates a steady and substantially homogeneous magnetic field having a strength of, for example 1.5 Tesla and extending in the z-direction in an examination zone, not shown more specifically. The z-direction extends here in the longitudinal direction of an examination table, not shown more specifically, on which a patient is located during an MR examination.

The nuclear magnetization in the examination zone can be excited by high-frequency pulses of a high-frequency coil 10, which is connected to a high-frequency amplifier 11 that amplifies the output signals of a high-frequency transmitter 12. In the high-frequency transmitter 12, the envelopes of the high-frequency pulses are modulated onto the carrier oscillations supplied by an oscillator, the frequency of these oscillations corresponding to the Larmor frequency (approximately 63 MHz for a main field of 1.5 Tesla). The complex envelope is loaded by the arithmetic-logic and control unit into a generator 14, which is coupled to the transmitter 12. Instead of a high-frequency coil with a high-frequency transmitter channel, a plurality of high-frequency coils each with a high-frequency transmitter channel can be provided.

The MR signals generated in the examination zone are picked up by a receiving coil 20 and amplified by an amplifier 21. The amplified MR signal is demodulated in a quadrature demodulator 22 by two carrier oscillations of the oscillator 13 offset through 90° with respect to one another, so that two signals are produced, which can be taken as the real component and the imaginary component of a complex MR signal. These signals are supplied to an analog-to-digital converter 23, which forms MR data therefrom. The MR data is subjected to different processing steps in an evaluation unit 24, inter alia a Fourier transform. A plurality of high-frequency receiving channels for a plurality of receiving coils could also be present.

The operating sequence of the method according to the invention is explained below on the basis of the flow chart illustrated in FIG. 2. After the initialization in step 101, in step 102 a plurality of MR data sets for a plurality of MR images with different echo times is acquired by means of a first sequence. The variation with time of the first sequence is illustrated schematically in the left half of FIG. 3. The nuclear magnetization is excited by a slice-selective high-frequency pulse RF ($1^{st}$ line); the slice selection gradient needed for this is not shown. After excitation of the nuclear magnetization, a phase encoding gradient Gy ($2^{nd}$ line) is activated as well as a read-out gradient Gx ($3^{rd}$ line). The read-out gradient starts with a (negative) pre-phasing pulse, after which a first (positive) read-out pulse occurs, followed by a second (negative) read-out pulse, whereupon again a positive read-out pulse follows and so on. The positive and negative read-out pulses each have the same variation with time and the magnitude of the time integral over a read-out pulse is twice the magnitude of the time integral over the preceding pre-phasing pulse.

Each of the gradient echo signals received by the receiving coil 20 consequently has its maximum in the middle of a read-out pulse, from which the different echo times of the MR data acquired during the read-out pulses follow. These echo times and the number of gradient echoes and read-out pulses have to be selected so that the T2* relaxation process—accelerated at some locations of the examination zone by a contrast medium—can be tracked. The MR data acquired at each of the read-out pulses defines a trajectory in the k-space—in the example a straight line, which is the same for all read-out pulses because the phase encoding does not change after commencement of the read-out process. Nevertheless, the MR data acquired during the read-out pulses differs because of the T2* relaxation (and because of field inhomogeneities).

In order to sample the k-space completely, the examination zone accordingly has to be excited many times and the MR data associated with the gradient echoes has to be read out with respective different phase encodings, the k-space being sampled on parallel straight lines. The MR data produced during each of the read-out pulses can be combined to form a respective MR data set, which defines a preferably quadratic region of the k-space. These MR data sets a', b', c', d', indicated symbolically in FIG. 3, are assigned to the successive read-out pulses.

After a sequence of MR data sets have been acquired in this way in step 102 with a good time resolution that is adequate for tracking the relaxation process, in step 103 a smaller number of MR data sets—in an extreme case only one data set—is acquired by means of a second sequence, which is illustrated in the right-hand half of FIG. 3. The terms "first" and "second" do not denote the chronological order of the two sequences, but are intended merely to simplify identification of the sequences. The order of the steps 102 and 103 can thus also be reversed.

By means of the second sequence, one or more data sets are acquired for one respectively a plurality of high spatial resolution MR images of the same examination zone, which was also recorded by means of the first sequence. The two sequences are identical, but a read-out pulse of the second sequence lasts substantially longer and the phase encoding gradient can assume substantially greater values than in the case of the first sequence, so that a higher spatial resolution is achieved. On the other hand, with the time-expanded gradient echoes in the case of this second sequence, the T2* relaxation process can no longer be followed.

Preferably, the phase encoding steps are the same size as in the first sequence and the gradient echo signals are sampled at the same sampling frequency as in the first sequence. The result of this is that the k-space is sampled at its center at the same points as by the first sequence, but owing to the longer duration of the read-out pulses and the larger maximum phase encoding, the sampled k-space is substantially larger than in the case of the first sequence. The MR data sets acquired by the second sequence fill a preferably quadratic region of the k-space. These regions of the k-space are marked with A respectively B and are assigned to the individual read-out pulses.

At the boundaries situated in the examination zone, susceptibility jumps can occur, which lead to field inhomogeneities. In their vicinity, these field inhomogeneities cause phase shifts, which increase linearly with time. Since the echo times of the MR data sets acquired by means of the first sequence are generally not consistent with the echo times of the MR data sets of the second sequence, with which they are combined, different phase shifts of the data sets result. These could lead to reconstruction errors if the data sets are combined with one another without further ado and combination images are produced therefrom. Before the data sets are combined, the phase of the MR data sets acquired by means of the first sequence is therefore first of all corrected.

For that purpose, in step 104, first of all MR images Ia', Ib', Ic' and Id' are reconstructed from the complex MR data sets a', b', c' d' etc., by subjecting these data sets to an inverse Fourier transform. In step 105, the required phase corrections are determined, by comparing the MR images Ia' . . . Id' reconstructed in step 104 with one another voxel for voxel. If the voxels were not exposed to a field inhomogeneity, the phase is the same for each of the complex image values of these voxels. But if these voxels were exposed to a field inhomogeneity, then the phases of the voxels in the different MR images are different. From the phase difference and from the difference in the echo times with which the MR data sets belonging to the MR images were acquired, it is possible to calculate the magnitude of the field inhomogeneity or rather the speed at which the phase in the voxel in question changes.

From this, the required phase correction $\phi(x, y)$ can then be calculated in a simple way. This phase correction is nevertheless not selected so that the influence of the field inhomogeneities is eliminated; rather, for each voxel of an MR image there is produced the value that the voxel would have assumed if the associated MR data set had been acquired with an echo time the same as the echo time with which the MR data set A, B etc. of the second sequence, which is combined with the relevant MR data set of the first sequence, was acquired.

In step 106, the phases of the MR images Ia' . . . Id' are corrected with the determined phase corrections $\phi(x, y)$, so that MR images Ia, Ib, Ic, Id etc. corrected in step 106 are produced. Hence, a voxel—for example, of the image Ia—is assigned the phase that the relevant voxel would have assumed if the associated MR data set had been acquired with the echo time with which the MR data set A has been acquired, the MR data set a subsequently being combined with said data set A; the corrected MR images, however, represent the examination zone furthermore at the echo times at which the MR data sets a', b', c', d' etc. were acquired. Correspondingly, the phase of the voxels for the image Id is corrected as though the associated data set d' had been acquired with the same echo time as the data set B, with which the data set d is subsequently combined.

In step 107, the phase-corrected MR images Ia . . . Id are transformed by a Fourier transform back into the k-space again, resulting in corrected data sets a, b, c, d.

In step 108, the data sets are combined with one another. As is clear from FIG. 3, the corrected data sets a, b, for example, are combined with the MR data set A, and the MR data sets c and d are combined with the data set B of the second sequence. The combination is effected so that the center of the k-space is formed exclusively by the MR data sets a, b, c, d etc. acquired by means of the first sequence, and so that the region away from the center is filled with the component of the MR data sets A, B of the second sequence that has been acquired away from this center. By means of an inverse Fourier transform, from the combined MR data sets there are produced MR combination images, the spatial resolution of which corresponds to the spatial resolution achievable with the second sequence and the contrast and time resolution of which is determined by the MR data sets acquired by means of the first sequence.

The inverse transform of the MR images Ia . . . Id etc. in step 107 can be dispensed with if a respective MR image is reconstructed from the MR data sets A, B etc. by means of an inverse Fourier transform. In that case, however, the MR data from points in the k-space for which MR data were already acquired with the first sequence are set to zero. Complex addition of one of the MR images generated in this way and one of the MR images Ia . . . Id, etc. then results in the combination images.

From the combination images, in step 109 the relaxation time T2\* can be determined quantitatively and in terms of spatial resolution by directly tracking the change in the image amplitude in the individual voxels (the image amplitude corresponds to the magnitude of the complex image value resulting from the Fourier transform), thus producing the time characteristic thereof for the echo times at which the MR data sets a' . . . d' were acquired by means of the first sequence. It is a requirement for this that the examination zone is not moved and is free from movement during acquisition of all MR data sets. The quantitative determination of T2\* can here be effected by means of the customary mathematical methods or as described in the prior German Application 04103913.2 (DE 040223). If necessary, the data thus determined can be used to prepare a further image of the examination zone, which represents the spatial distribution of T2\*, the magnitude of T2\* being reproduced by corresponding gray scale values or colors.

The method then terminates (block 110).

The invention was described above with reference to an exemplary embodiment for determination of the relaxation time T2\*. Alternatively, it is possible in a similar manner to determine, for example, the relaxation time T2 in the examination zone. In that case, spin echo sequences have to be used instead of gradient echo sequences. Since field inhomogeneities in the case such sequences have no effect, steps 104 to 107 in the flowchart shown in FIG. 2 can be omitted. Alternatively, it is possible in a similar manner to determine the course of the longitudinal relaxation time T1, wherein as the sequence there can be used what is known as an inversion recovery sequence, in which first of all the longitudinal magnetization is inverted by a 180° high frequency pulse and then is read out with other high frequency pulses. T1 can also be determined with a different sequence, which delivers MR images of which the contrast is determined essentially by the T1 relaxation, for example, what is known as a saturation recovery sequence.

Instead of the sequences shown in FIG. 1, in which the k-space is sampled along parallel straight lines, the MR data sets can also be acquired by means of the projection reconstruction method, in which the k-space is sampled along straight lines that intersect at the zero point of the k-space.

In the case of the above-described combination of the MR data sets, the MR data sets a, b, c, d etc. of the first sequence each enter with a weighting other than zero, for example, 1. That section of the MR data sets A, B of the second sequence, however, that was likewise acquired at the center of the k-space is ignored, that is, this section enters with a weighting of zero. Alternatively, however, this section can be allowed to enter with a weighting other than zero, so that, for example, a linear combination of MR data of the first and the second sequences is used for the center of the k-space. In that case, however, the MR data of the first sequence should generally enter with a greater weighting than the MR data of the second sequence.

In the preceding description, only MR data from the center was acquired with the first sequence. Alternatively, however, with the first sequence it is possible additionally to acquire MR data with a marked phase encoding, to which in the k-space a line away from the center corresponds. In this case, the corresponding MR data of the second sequence are likely to be ignored or considered only with a lower weighting when generating the combination image. In special cases, for example, in the examination of linear structures, such as blood vessels, it is even conceivable to configure the first sequence in such a way that MR data from the center of the k-space cannot be acquired, or can only be partly acquired.

In the exemplary embodiment shown in FIG. 3, MR data from a (two-dimensional) slice were acquired with the sequences. Alternatively, it is possible to examine a (three-dimensional) volume using the method according to the invention. The important factor therein is that with both sequences also in this case MR data are acquired from one and the same volume and that during the acquisition this volume does not move or no movements occur therein.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MR method for spatially resolved determination of relaxation parameters in an examination zone, comprising the steps:
    a. acquisition, by means of a first sequence, of MR data sets for a plurality of MR images with different echo times,
    b. acquisition, by means of a second sequence, of at least one further MR data set for at least one further MR image, having an enhanced spatial resolution and reduced time resolution compared with the MR images of the first sequence,
    c. generation of MR combination images using an MR data set derived from the first sequence for a portion within the k-space and MR data of a further MR data set acquired outside this portion of the k-space by means of the second sequence,
    d. derivation of relaxation parameters from the MR combination images,
    wherein at least the first sequence is a multi-echo sequence in which, following an excitation of the nuclear magnetization in the examination zone, a plurality of MR echo signals are received for in each case the same trajectory in the k-space;
    wherein the sequences are spin echo sequences.

2. An MR method as claimed in claim 1, further including: measuring T2 relaxation parameters.

3. An MR method comprising:
    with a magnetic resonance scanner, applying a first MR sequence and acquiring a first plurality of MR data sets in a first portion of k-space with different echo times,
    with the magnetic resonance scanner, applying a second MR sequence and acquiring a second MR data set in a second region of k-space, the second MR data set having higher spatial resolution than the first MR data sets and lower time resolution than the first MR data sets, the second region of k-space being larger than and including the first region of k-space,
    with one or more processors, reconstructing a lower spatial resolution MR image from each first MR data set,
    with the one or more processors, determining spatially dependent phase shift corrections on the basis of the lower spatial resolution MR images taking into account the different echo times of each MR image,
    with the one or more processors, correcting the phase of the lower spatial resolution MR images with the determined phase shift corrections,
    with the one or more processors, generating higher spatial resolution combination images using the determined phase shift corrections, the first MR data sets, and a portion of the second MR data set in a second region of k-space outside of the first region of k-space,
    with the one or more processors, determining relaxation parameters from the combination images,
    on a display device, displaying the determined relaxation parameters.

4. The method as claimed in claim 3, further including: determining a spatial distribution of contrast medium in the MR images.

5. The method as claimed in claim 3, wherein determining the spatially dependent phase shift corrections includes:
    comparing phases of voxels of the lower spatial resolution images voxel by voxel, to determine the phase shifts between the lower spatial resolution images.

6. The method as claimed in claim 5, wherein generating the higher spatial resolution combined image includes:
    correcting the lower spatial resolution images for the determined phase shifts and for echo time differences relative to the second MR data set,
    transforming the corrected lower spatial resolution images into data space to create corrected first MR data sets,
    combining each corrected MR data set with the portion of the second MR data set outside of the first region of k-space and reconstructing to generate a plurality of the combination images.

7. The method as claimed in claim 6, wherein determining the relaxation parameters includes:
    tracking an amplitude change of the combined images voxel by voxel and determining a $T2^*$ relaxation time for each voxel, and
    displaying on a display device, an image depicting the $T2^*$ relaxation times of the voxels.

8. The method as claimed in claim 3, wherein the first sequence is a spin echo sequence and determining the relaxation parameters includes determining T2 relaxation parameters.

9. The method as claimed in claim 3, wherein the first sequence includes one of an inversion recovery sequence and a saturation recovery sequence, and determining the relaxation parameters includes:
    determining T1 relaxation parameters.

10. The method as claimed in claim 3, wherein generating the composition image includes:
    combining the first MR data sets with a portion of the second MR data set outside of the first portion of k-space and weightingly combining the first MR data sets with a portion of the second MR data set in the first portion of k-space.

11. An MR apparatus for determining spatially resolved relaxation parameters, the apparatus comprising:
    a magnetic resonance scanner which applies magnetic resonance scan sequences to and generates MR data from a subject in an examination zone;
    one or more processors programmed to:
        control the magnetic resonance scanner to apply a first scan sequence and generate a plurality of first MR data sets having different echo times and different spatially dependent phase shifts,
        control the magnetic resonance scanner to apply a second scan sequence and generate at least one second MR data set having an enhanced spatial resolution and reduced time resolution in comparison with the first MR data sets, images generated from the first MR data sets having a lower spatial resolution and a higher temporal resolution than an image generated from the second MR data set, correcting the first MR data sets for the different phase shifts and echo times, combining each of the first MR data sets with a portion of the at least one second data set to generate a series of combined images, and from the series of combined images, generating a quantitative relaxation time value for each voxel.

12. The apparatus as claimed in claim 11, wherein the one or more processors are programmed to perform the step of correcting the first MR data sets for different phase shifts and echo times by:

reconstructing the first data sets into a series of lower spatial resolution images, comparing corresponding pixels of the series of lower resolution images to determine relative phase shifts, correcting phases of the lower spatial resolution MR images in accordance with the determined phase differences, and transforming the phase corrected series of lower spatial resolution images into corrected first MR data sets for combining with portions of the at least one second MR data set.

13. The apparatus as claimed in claim 11, wherein the first MR data sets correspond to a central region of k-space and the at least one second MR data set has a first portion corresponding to the central region of k-space and a second portion corresponding to peripheral portions of k-space and wherein the one or more processors are programmed to perform the combining step by:

performing a weighted combination of the first MR data sets and the first portion of the at least one second MR data set and with the second portion of the at least one second MR data set.

14. The method as claimed in claim 11, wherein the processor is further programmed to perform the step of determining the spatially dependent phase shifts includes:

comparing phases of voxels of the lower spatial resolution images voxel by voxel to determine the relative phase shifts between the lower spatial resolution images.

15. The apparatus as claimed in claim 11, wherein generating the qualitative relaxation times includes:

tracking an amplitude change of the combination images voxel by voxel to determine a T2* relaxation time for each voxel.

16. The apparatus as claimed in claim 11, wherein the first sequence includes a spin echo sequence and determining the quantitative relaxation time values includes determining T2 relaxation time values.

17. The apparatus as claimed in claim 11, wherein generating the qualitative relaxation time values for each voxel includes determining a T1 relaxation time value for each voxel.

18. The apparatus as claimed in claim 17, wherein the first sequence includes one of an inversion recovery sequence and a saturation recovery sequence.

19. A non-transitory computer-readable medium carrying a computer program which controls one or more processors to carry out the method as claimed in claim 3.

* * * * *